United States Patent
Ahn et al.

(10) Patent No.: US 11,469,133 B2
(45) Date of Patent: Oct. 11, 2022

(54) BONDING APPARATUS AND SEMICONDUCTOR PACKAGE FABRICATION EQUIPMENT INCLUDING THE SAME

(71) Applicant: SAMSUNG ELECTRONICS CO., LTD., Suwon-si (KR)

(72) Inventors: Seok Geun Ahn, Cheonan-si (KR); Min Keun Kwak, Asan-si (KR); Ji Won Shin, Sejong-si (KR); Sang Hoon Lee, Seoul (KR); Byoung Wook Jang, Asan-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 400 days.

(21) Appl. No.: 16/805,951

(22) Filed: Mar. 2, 2020

(65) Prior Publication Data

US 2020/0388522 A1 Dec. 10, 2020

(30) Foreign Application Priority Data

Jun. 4, 2019 (KR) ......................... 10-2019-0065843

(51) Int. Cl.
| | | |
|---|---|---|
| *H01L 29/76* | (2006.01) | |
| *H01L 29/94* | (2006.01) | |
| *H01L 31/062* | (2012.01) | |
| *H01L 21/683* | (2006.01) | |
| *H01L 21/67* | (2006.01) | |

(Continued)

(52) U.S. Cl.
CPC ........ *H01L 21/6838* (2013.01); *B23K 37/047* (2013.01); *H01L 21/67121* (2013.01); *H01L 24/16* (2013.01); *H01L 24/81* (2013.01); *H01L 24/83* (2013.01); *B23K 2101/40* (2018.08); *H01L 2224/81801* (2013.01)

(58) Field of Classification Search
CPC ................. H01L 21/6838; H01L 24/16; H01L 2224/131; H01L 2224/16147; H01L 2224/16237; H01L 2224/75303; H01L 2224/75305; H01L 2224/75745; H01L 2224/80801; H01L 2224/81191; H01L 2224/814; H01L 2924/3511; B23K 37/047; B23K 2101/40
USPC ....................................................... 257/276
See application file for complete search history.

(56) References Cited

U.S. PATENT DOCUMENTS

| | | |
|---|---|---|
| 5,425,491 A | 6/1995 | Tanaka et al. |
| 6,561,825 B1 | 5/2003 | McHugh et al. |

(Continued)

*Primary Examiner* — Theresa T Doan
(74) *Attorney, Agent, or Firm* — Sughrue Mion, PLLC

(57) ABSTRACT

A bonding apparatus includes a body part; a vacuum hole disposed in the body part; a first protruding part protruding in a first direction from a first surface of the body part; a second protruding part protruding from the first surface of the body part in the first direction and spaced farther apart from a center of the first surface of the body part than the first protruding part in a second direction intersecting with the first direction; and a trench defined by the first surface of the body part and second surfaces of the first protruding part, the second surfaces protruding in the first direction from the first surface of the body part, and the trench being connected to the vacuum hole, wherein the second protruding part protrudes farther from the first surface of the body part in the first direction than the first protruding part.

20 Claims, 11 Drawing Sheets

(51) Int. Cl.
    *B23K 37/047*     (2006.01)
    *H01L 23/00*     (2006.01)
    *B23K 101/40*     (2006.01)

(56) References Cited

U.S. PATENT DOCUMENTS

| | | |
|---|---|---|
| 7,134,588 B2 | 11/2006 | Kobae et al. |
| 7,182,118 B2 | 2/2007 | Cheung et al. |
| 7,407,877 B2 | 8/2008 | Kweon et al. |
| 7,566,585 B2 | 7/2009 | Theuss |
| 7,650,688 B2 | 1/2010 | Lee et al. |
| 7,677,429 B2 | 3/2010 | Chapman et al. |
| 7,736,950 B2 | 6/2010 | Pendse et al. |
| 8,870,051 B2 | 10/2014 | Brofman et al. |
| 2012/0223027 A1* | 9/2012 | Lundt ................. B01D 21/307 210/521 |
| 2021/0074657 A1* | 3/2021 | Wakioka ................ H01L 24/75 |

* cited by examiner

BONDING APPARATUS AND SEMICONDUCTOR PACKAGE FABRICATION EQUIPMENT INCLUDING THE SAME

CROSS-REFERENCE TO RELATED APPLICATION

This application claims priority to Korean Patent Application No. 10-2019-0065843, filed on Jun. 4, 2019, in the Korean Intellectual Property Office, the disclosure of which is incorporated herein by reference in its entirety.

BACKGROUND

1. Technical Field

Apparatuses consistent with example embodiments relate to a bonding apparatus and semiconductor package fabrication equipment including the same, and more particularly, to a bonding apparatus for mounting substrates for a semiconductor package and semiconductor package fabrication equipment including the same.

2. Description of the Related Art

As the technological developments have advanced in the electronics industry, the demand for high-performance, high-speed and compact electronic components continues to grow. To keep up with this growing demand, a method of stacking or mounting multiple semiconductor chips on a single semiconductor package or multiple semiconductor packages are stacked is being developed. For example, a Package-in-Package (PiP)-type semiconductor package and a Package-on-Package (PoP)-type semiconductor package are being developed.

As semiconductor packages have become more compact in size, a problem has arisen in which substrates for semiconductor packages easily warp during the fabrication of semiconductor packages and thereby cause defects. This warpage of the substrates is attributed to different thermal expansion coefficients of various materials being used in the fabrication of a semiconductor package.

SUMMARY

One or more example embodiments provide a bonding apparatus capable of improving the reliability of the connection between substrates for a semiconductor package to reduce the warpage of the substrates.

One or more example embodiments also provide semiconductor package fabrication equipment including a bonding apparatus capable of improving the reliability of the connection between substrates for a semiconductor package.

However, embodiments of the present disclosure are not restricted to those set forth herein. The above and/or other example embodiments will become more apparent to one of ordinary skill in the art by referencing the detailed description of the disclosure provided below.

According to an aspect of an example embodiment, there is provided a bonding apparatus including: a body part; a vacuum hole disposed in the body part; a first protruding part protruding in a first direction from a first surface of the body part; a second protruding part protruding from the first surface of the body part in the first direction and spaced farther apart from a center of the first surface of the body part than the first protruding part in a second direction intersecting with the first direction; and a trench defined by the first surface of the body part and second surfaces of the first protruding part, the second surfaces protruding in the first direction from the first surface of the body part, and the trench being connected to the vacuum hole, wherein the second protruding part protrudes farther from the first surface of the body part in the first direction than the first protruding part.

According to an aspect of another example embodiment, there is provided a bonding apparatus including: a body part; a vacuum hole disposed in the body part and extending through the body part from a first surface of the body part to a second surface opposite to the first surface of the body part; a first protruding part protruding from the first surface of the body part in a first direction; and a second protruding part protruding from the first surface of the body part farther from the first surface of the body part than the first protruding part, the second protruding part being disposed farther from a center of the first surface of the body part than the first protruding part.

According to an aspect of an example embodiment, there is provided a bonding apparatus to which a substrate for a semiconductor package is adhered, the bonding apparatus including: a body part having a first surface facing the substrate; a first protruding part protruding in a first direction from the first surface of the body part; and a second protruding part protruding in the first direction from the first surface of the body part farther from the first surface than the first protruding part, the second protruding part being spaced farther from a center of the first surface of the body part than the first protruding part in a second direction intersecting the first direction, wherein when the substrate is adhered to the bonding apparatus, the substrate is in contact with a first contact surface of the first protruding part and a second contact surface of the second protruding part.

Other features and embodiments may be apparent from the following detailed description, the drawings, and the claims.

BRIEF DESCRIPTION OF THE DRAWINGS

The above and/or other aspects and features will become more apparent by describing in detail example embodiments with reference to the attached drawings, in which.

DETAILED DESCRIPTION

Semiconductor package fabrication equipment according to example embodiments will hereinafter be described with reference to FIGS. 1 through 5D.

Figure 1:
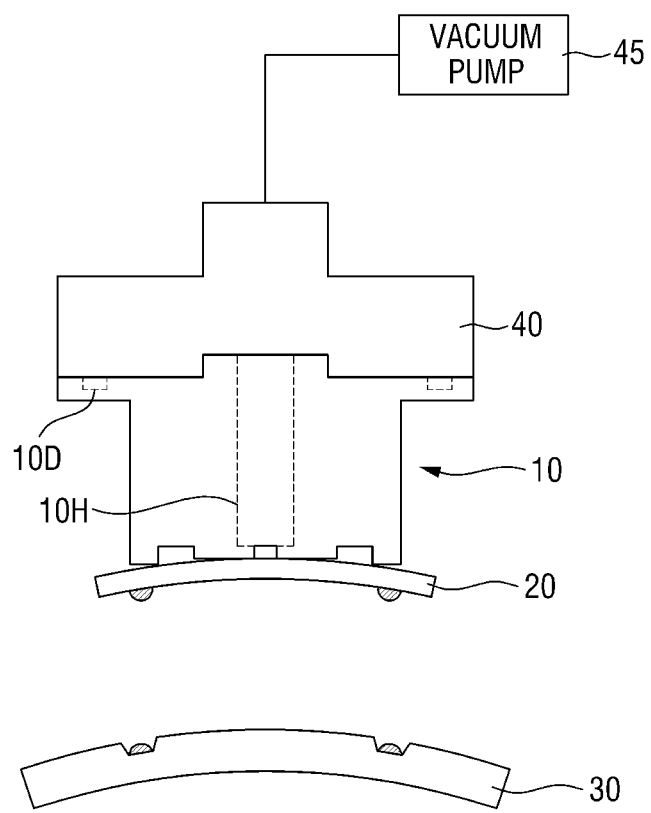
FIG. 1 is a schematic view illustrating semiconductor package fabrication equipment according to an example embodiment.
Figure 2:
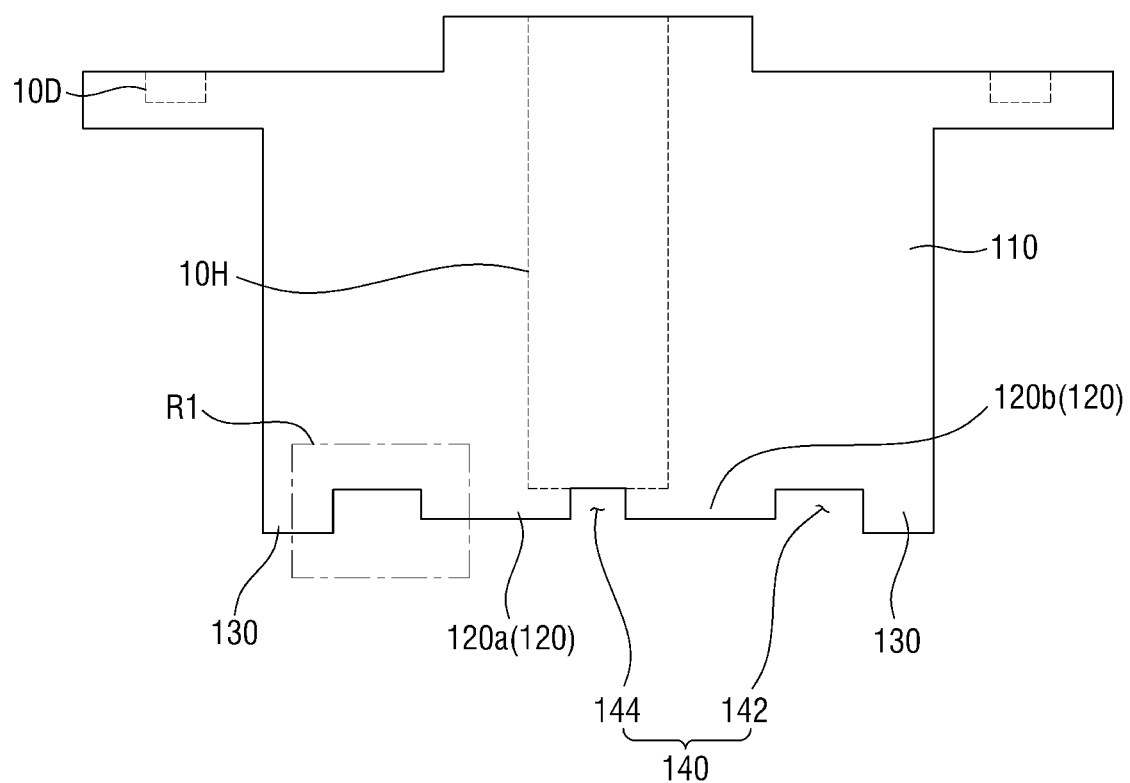
FIG. 2 is a schematic view illustrating a bonding apparatus of FIG. 1 according to an example embodiment.
Figure 3:
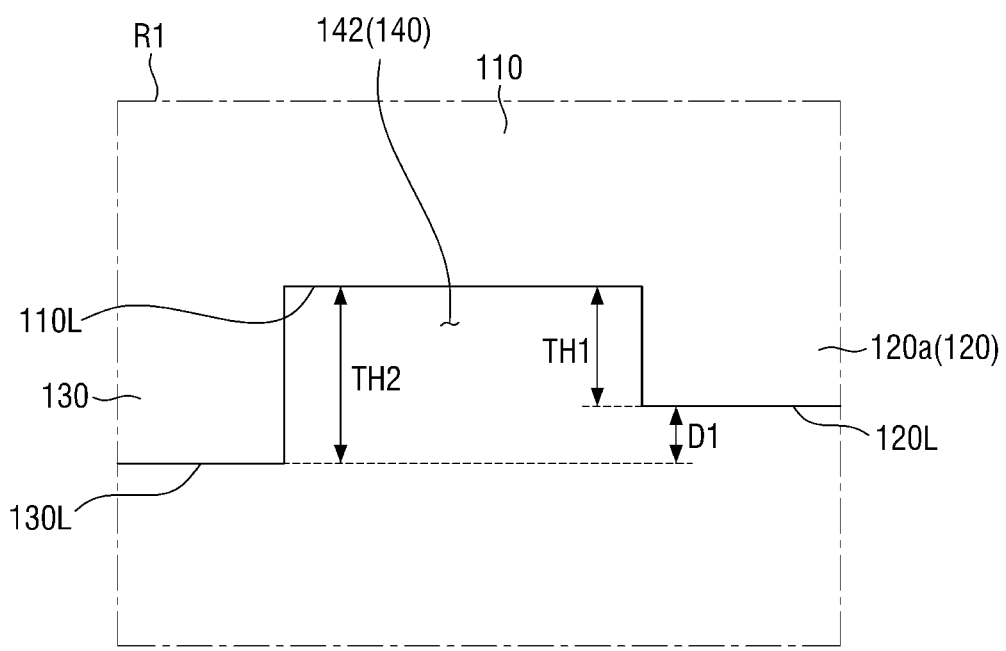
FIG. 3 is an enlarged view illustrating an area R1 of FIG. 2
Figure 4:
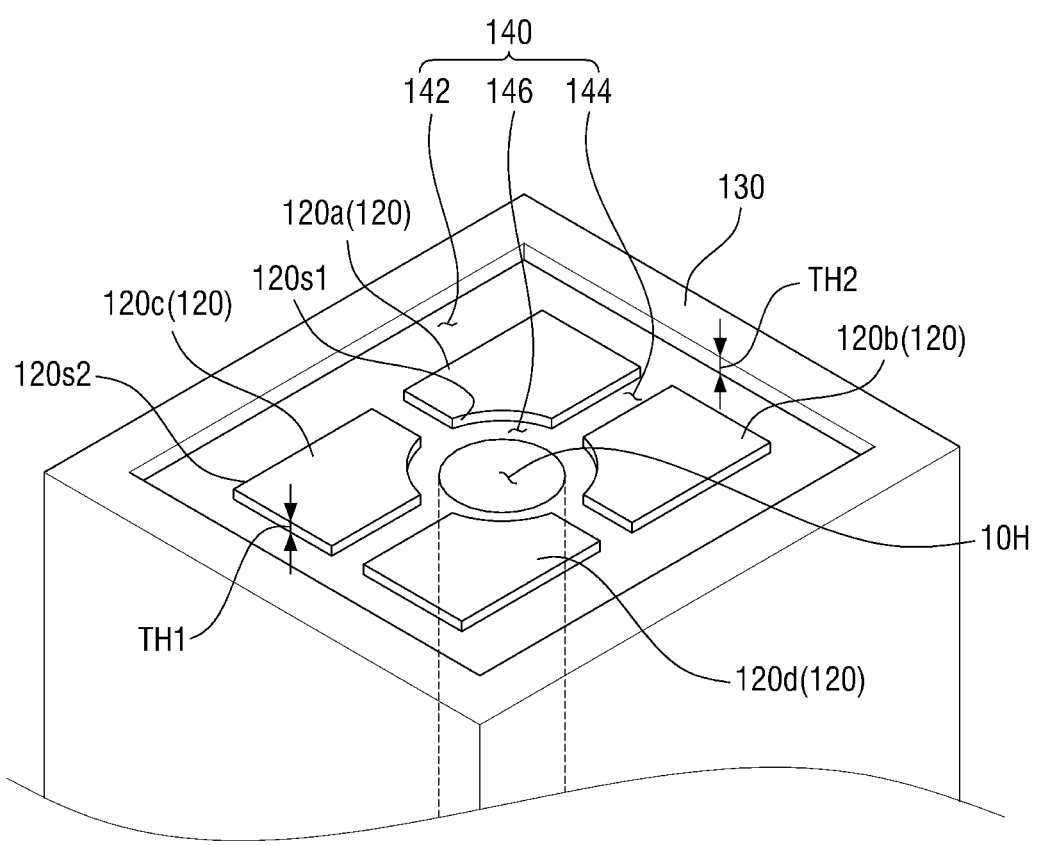
FIG. 4 is a bottom perspective view illustrating the bottom of the bonding apparatus of FIG. 2

FIG. 1 is a schematic view illustrating semiconductor package fabrication equipment according to an example embodiment. FIG. 2 is a schematic view illustrating a bonding apparatus 10 of FIG. 1 according to an example embodiment. FIG. 3 is an enlarged view illustrating an area R1 of FIG. 2. FIG. 4 is a bottom perspective view illustrating the bottom of the bonding apparatus of FIG. 2.

Referring to FIG. 1, the semiconductor package fabrication equipment includes a bonding apparatus 10.

The bonding apparatus 10 may mount a first semiconductor package substrate 20 on a second semiconductor package substrate 30.

The bonding apparatus 10 may pick up the first semiconductor package substrate 20. For example, the first semiconductor package substrate 20 may be adhered to the bonding apparatus 10 by vacuum pressure. In an example embodiment, the bonding apparatus 10 may include a vacuum hole 10H. Vacuum pressure may be applied to the bottom surface of the bonding apparatus 10 through the vacuum hole 10H. Accordingly, the top surface of the first semiconductor package substrate 20 may be in contact with the bottom surface of the bonding apparatus 10.

The first semiconductor package substrate 20 may be a semiconductor chip (e.g., a logic semiconductor chip or a memory semiconductor chip), a semiconductor substrate (e.g., a silicon substrate), a printed circuit board (PCB), a ceramic substrate, or an interposer, but the example embodiment is not limited thereto. The first semiconductor package substrate 20 will hereinafter be described as being, for example, an interposer.

In an example embodiment, the bonding apparatus 10 may be connected to a vacuum pump 45. The vacuum pump 45 may apply vacuum pressure to the bottom surface of the bonding apparatus 10 by depressurizing the inside of the vacuum hole 10H.

The bonding apparatus 10 may place the first semiconductor package substrate 20 over the second semiconductor package substrate 30.

The second semiconductor package substrate 30 may be a semiconductor chip (e.g., a logic semiconductor chip or a memory semiconductor chip), a semiconductor substrate (e.g., a silicon substrate), a PCB, a ceramic substrate, or an interposer, but embodiments are not limited thereto. The second semiconductor package substrate 30 will hereinafter be described as being, for example, a PCB.

The bonding apparatus 10 may be formed of, for example, a polymer or a plastic resin, but embodiments are not limited thereto.

In an example embodiment, the bonding apparatus 10 may be fixed to a frame 40. For example, the bonding apparatus 10 may include grooves 10D at the top thereof. Parts of the frame 40 may be inserted in the grooves 10D of the bonding apparatus 10 and may thus be coupled to the bonding apparatus 10. Accordingly, the top of the bonding apparatus 10 may be fixed to the frame 40. However, embodiments are not limited to this. The bonding apparatus 10 may be fixed to the frame 40 in various manners other than described herein.

In an example embodiment, the frame 40 may be transported (or driven to be moved). For example, the frame 40 may be transported in a vertical direction or in a horizontal direction. Accordingly, the bonding apparatus 10, which is fixed to the frame 40, may also be transported. The bonding apparatus 10 may be driven to be moved to pick up the first semiconductor package substrate 10 and/or to provide the first semiconductor package substrate 20 over the second semiconductor package substrate 30. In an example embodiment, the frame 40 may be driven to be rotatably moved.

In an example embodiment, the vacuum pump 45 may apply vacuum pressure to the vacuum hole 10H of the bonding apparatus 10 extending through the frame 40. For example, the vacuum pump 45 may be connected to the frame 40.

Referring to FIGS. 2 through 4, the bonding apparatus 10 may include a body part 110, the vacuum hole 10H, a first protruding part 120, a second protruding part 130, and a first trench 140.

FIG. 4 illustrates that the body part 110 is substantially in the shape of a rectangular column, but embodiments are not limited thereto. The body part 110 may be in various shapes that are suitable for picking up the first semiconductor package substrate 20. For example, the body part 110 may be in the shape of a cylindrical column or a polygonal column other than a rectangular column.

The vacuum hole 10H may be formed in the body part 110. For example, the vacuum hole 10H may extend from a bottom surface 110L of the body part 110. That is, as illustrated in FIG. 4, the vacuum hole 10H may be exposed on the bottom surface 110L of the body part 110.

FIG. 4 illustrates that the vacuum hole 10H is in the shape of a cylindrical column, but the example embodiment is not limited thereto. Alternatively, for example, the vacuum hole 10H may be in the shape of a polygonal column such as a rectangular column or the like.

In an example embodiment, the vacuum hole 10H may extend from the bottom surface 110L of the body part 110 to penetrate through the body part 110. For example, as illustrated in FIG. 2, the vacuum hole 10H may extend from the bottom surface to the top surface of the body part 110. As described above with reference to FIG. 1, by the vacuum hole 10H extending from the bottom surface to the top surface of the body part 110, vacuum pressure may be applied to the bottom surface 110L of the body part 110 by the vacuum hole 10H.

The first protruding part 120 may protrude from the bottom surface 110L of the body part 110. The second protruding part 130 may protrude from the bottom surface 110L of the body part 110, particularly, from a different portion of the bottom surface 110L of the body part 110 from the first protruding part 120. Specifically, the second protruding part 130 may be farther apart from the center of the bottom surface 110L of the body part 110 than the first protruding part 120. That is, the second protruding part 130 may be located closer to the edges of the bottom surface 110L of the body part 110 than the first protruding part 120.

In an example embodiment, the vacuum hole 10H may be formed at the center of the body part 110. For example, the vacuum hole 10H may extend from the center of the bottom surface 110L of the body part 110 to the center of the top surface (opposite to the bottom surface 110L) of the body part 110. In this example embodiment, the first protruding part 120 may be disposed closer to the vacuum hole 10H than the second protruding part 130. For example, the first protruding part 120 may be disposed between the vacuum hole 10H and the second protruding part 130.

The second protruding part 130 may protrude beyond the first protruding part 120 in the protruding direction of the first protruding part 120 and the second protruding part 130. For example, as illustrated in FIG. 3, a bottom surface (or second contact surface) 130L of the second protruding part 130 may be formed to be lower than a bottom surface (or first contact surface) 120L of the first protruding part 120 by as much as a first distance D1. The second protruding part 130 protrudes farther from the bottom surface 110L of the body part 110 in the protruding direction than the first protruding part 120. That is, a plane including the bottom surface (or second contact surface) 130L of the second protruding part 130 may be formed to be lower (or farther from the bottom surface 110L of the body part 110) than a plane including the bottom surface (or first contact surface) 120L of the first protruding part 120 by as much as the first distance D1.

The first protruding part 120 may have a first thickness TH1, and the second protruding part 130 may have a second thickness TH2. The first thickness TH1 of the first protruding part 120 may correspond to the distance (a thickness or a height) from the bottom surface 110L of the body part 110 to the bottom surface 120L (or first contact surface) of the first protruding part 120. The second thickness TH2 of the second protruding part 130 may correspond to the distance (a thickness or a height) from the bottom surface 110L of the body part 110 to the bottom surface (or second contact surface) 130L of the second protruding part 130.

In an example embodiment, the first thickness TH1 of the first protruding part 120 may be smaller than the second thickness TH2 of the second protruding part 130. Accordingly, the bottom surface (or second contact surface) 130L of the second protruding part 130 may be formed to be lower than the bottom surface (or first contact surface) 120L of the first protruding part 120. For example, the first distance D1 may correspond to the difference between the first and second thicknesses TH1 and TH2.

However, embodiments are not limited to this example. That is, the first thickness TH1 may be the same as, or greater than, the second thickness TH2 as long as the second protruding part 130 protrudes beyond the first protruding part 120. For example, in a case where the bottom surface 110L of the body part 110 is inclined, the first thickness TH1 may be the same as, or greater than, the second thickness TH2.

As a result, the height of the bottom surface of the bonding apparatus 10 may increase in a direction from the edges to the center of the bottom surface of the bonding apparatus 10. Accordingly, the first semiconductor package substrate 20 adhered to the bonding apparatus 10 can be a curve (a concave downward curve as shown in FIG. 1). This will be described later in detail with reference to FIGS. 5A through 5D.

In an example embodiment, the difference between the bottom surface 120L (or first contact surface) of the first protruding part 120 and the bottom surface (or second contact surface) 130L of the second protruding part 130 (i.e., the first distance D1) may be 500 µm or less. If the first distance D1 exceeds 500 µm, the first semiconductor package substrate 20 adhered to the bonding apparatus 10 may be damaged.

The first distance D1 may be 100 µm to 300 µm. If the first distance D1 is 100 µm or greater, the first semiconductor package substrate 20 can be mounted on the second semiconductor package substrate 30, which has its own warpage, with a high reliability. If the first distance D1 is 300 µm or less, damage to the first semiconductor package substrate 20 adhered to the bonding apparatus 10 can be minimized.

In an example embodiment, as illustrated in FIG. 4, the second protruding part 130 may be disposed along the outer edge(s) of the bottom surface 110L of the body part 110. That is, in a case where the body part 110 is in the shape of a rectangular column, the second protruding part 130 may extend in a rectangular shape.

In an example embodiment, the first protruding part 120 may include a plurality of sub-protrusion parts. For example, as illustrated in FIG. 4, the first protruding part 120 may include first, second, third, and fourth sub-protruding parts 120a, 120b, 120c, and 120d.

The first, second, third, and fourth sub-protruding parts 120a, 120b, 120c, and 120d may be disposed between the vacuum hole 10H and the second protruding part 130. In an example embodiment, the first, second, third, and fourth sub-protruding parts 120a, 120b, 120c, and 120d may be arranged to surround the vacuum hole 10H.

For example, the first sub-protruding part 120a may be disposed between the vacuum hole 10H and the second protruding part 130. The second sub-protruding part 120b may be spaced apart from the first sub-protruding part 120a in a direction X which is parallel to the bottom surface 110L of the body part 110. The third sub-protruding part 120c may be spaced apart from the first sub-protruding part 120a in a second direction Y which intersects the first direction X. The second direction Y is illustrated as intersecting the first direction X, but the example embodiment is not limited thereto. The fourth sub-protruding part 120d may be spaced apart from the first sub-protruding part 120a with the vacuum hole 10H interposed therebetween.

In an example embodiment, the first, second, third, and fourth sub-protruding parts 120a, 120b, 120c, and 120d may be arranged symmetrically with respect to the vacuum hole 10H. For example, in a case where the second protruding part 130 extends in a rectangular shape, the first, second, third, and fourth sub-protruding parts 120a, 120b, 120c, and 120d may be arranged at the corner portions of the second protruding part 130.

Because the first and second protruding parts 120 and 130 protrude from the bottom surface 110L of the body part 110, the first trench 140 may be formed at the bottom of the bonding apparatus 10. For example, the first trench 140 may be defined by the bottom surface 110L of the body part 110 and the sides (or side surfaces) of the first protruding part 120 and the sides (side surfaces) of the second protruding part 130. Also, because the vacuum hole 10H extends from the bottom surface of the body part 110, the first trench 140 may be connected to the vacuum hole 10H.

In an example embodiment, the first and second protruding parts 120 and 130 may be spaced apart from each other. For example, as illustrated in FIGS. 3 and 4, the first trench 140 may include a first portion 142 (hereinafter a first part 142) which is disposed between the first and second protruding parts 120 and 130. The first part 142 of the first trench 140 may be defined by the bottom surface 110L of the body part 110, the sides of the first protruding part 120, and the sides of the second protruding part 130. In an example embodiment, in a case where the second protruding part 130 extends in a rectangular shape, the first part 142 of the first trench 140 may also extend in a rectangular shape.

In an example embodiment, the first, second, third, and fourth sub-protruding parts 120a, 120b, 120c, and 120d may be spaced apart from one another. For example, as illustrated in FIG. 4, the first trench 140 may further include a second portion 144 of the first trench 140 (hereinafter a second part 144) which separates the first, second, third, and fourth sub-protruding parts 120a, 120b, 120c, and 120d from one another.

For example, the second part 144 of the first trench 140 may be disposed between the first and second sub-protruding parts 120a and 120b. The second part 144 of the first trench 140 may be defined by, for example, the bottom surface 110L of the body part 110, the sides of the first sub-protruding part 120a, and the sides of the second sub-protruding part 120b. In a case where the first and second sub-protruding parts 120a and 120b are spaced apart from each other in the first direction X, the second part 144 may extend in the second direction Y between the first and second sub-protruding parts 120a and 120b.

Also, the second part 144 of the first trench 140 may be interposed between the first and third sub-protruding parts 120a and 120c. The second part 144 of the first trench 140 may be defined by, for example, the bottom surface 110L of the body part 110, the sides of the first sub-protruding part 120a, and the sides of the third sub-protruding part 120c. In a case where the first and third sub-protruding parts 120a and 120c are spaced apart from each other in the second direction Y, the second part 144 may extend in the first direction X between the first and third sub-protruding parts 120a and 120c.

In an example embodiment, the vacuum hole 10H and the first protruding part 120 may be spaced apart from each other. For example, as illustrated in FIG. 4, the first trench 140 may further include a third portion of the first trench 140 (hereinafter a third part 146) which is disposed between the vacuum hole 10H and the first protruding part 120. The third part 146 of the first trench 140 may be defined by, for example, the bottom surface 110L of the body part 110 and the side surfaces of the first protruding part 120. In an example embodiment, in a case where the vacuum hole 10H has a cylindrical shape, the third part 146 of the first trench 140 may extend in a circular shape.

In an example embodiment, the third part 146 of the first trench 140 may be connected to the vacuum hole 10H. In an example embodiment, the second part 144 of the first trench 140 may connect the first and third parts 142 and 146 of the first trench 140. Accordingly, vacuum pressure provided by the vacuum hole 10H may be applied through the first, second, and third parts 142, 144, and 146.

In an example embodiment, at least one surface of the side surfaces of the first protruding part 120 may extend along the profile of the side of the vacuum hole 10H. For example, as illustrated in FIG. 4, the first protruding part 120 (particularly, the first sub-protruding part 120a) may include a first side 120s1 that faces the vacuum hole 10H. The first side 120s1 may extend along the profile of the side surface of the vacuum hole 10H. For example, in a case where the vacuum hole 10H has a cylindrical shape, the first side 120s1 may have an arc shape.

In an example embodiment, at least one of the side surfaces of the first protruding part 120 may extend along the profiles of the side surfaces of the second protruding part 130. For example, as illustrated in FIG. 4, the first protruding part 120 (particularly, the second sub-protruding part 120b) may include a second side 120s2 that faces the second protruding part 130. The second side 120s2 may extend along the profile of a side of the second protruding part 130 that faces the first protruding part 120. For example, in a case where the second protruding part 130 extends in a rectangular shape, the second side 120s2 may have an L shape.

The operation of the bonding apparatus 10 will hereinafter be described with reference to FIGS. 5A, 5B, 5C, and 5D.

FIGS. 5A, 5B, 5C, and 5D are cross-sectional views illustrating how to mount substrates for a semiconductor package using a bonding apparatus 10 according to an example embodiment.

Figure 5A:
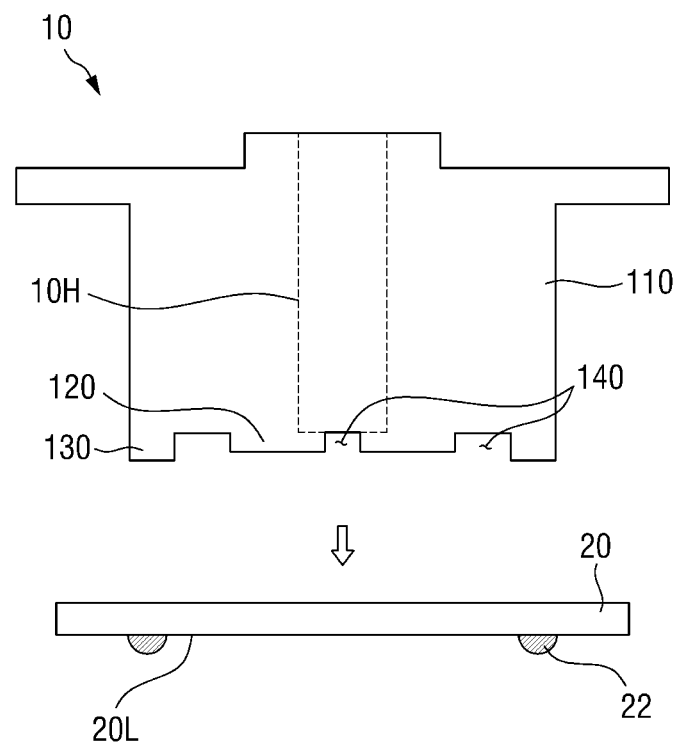
FIGS. 5A, 5B, 5C, and 5D are cross-sectional views illustrating how to mount substrates for a semiconductor package using a bonding apparatus according to an example embodiment.

Referring to FIG. 5A, the bonding apparatus 10 may be provided over the first semiconductor package substrate 20.

The bottom surface of the bonding apparatus 10 may be arranged to face the top surface of the first semiconductor package substrate 20. That is, the bottom surface of the first protruding part 120 and the bottom surface of the second protruding part 130 may face the top surface of the first semiconductor package substrate 20.

The bonding apparatus 10 may be driven by, for example, the frame 40 of FIG. 1, and may be provided over the first semiconductor package substrate 20.

In an example embodiment, first connecting members 22 may be formed on a bottom surface 20L of the first semiconductor package substrate 20. The first connecting members 22 may be formed, for example, along the edges of the bottom surface 20L of the first semiconductor package substrate 20.

The first connecting members 22 may be used to electrically connect the first semiconductor package substrate 20 to another semiconductor package substrate (e.g., the second semiconductor package substrate 30 of FIG. 1). The first connecting members 22 may include, for example, micro-bumps, solder balls, and the like, but embodiments are not limited thereto.

Figure 5B:
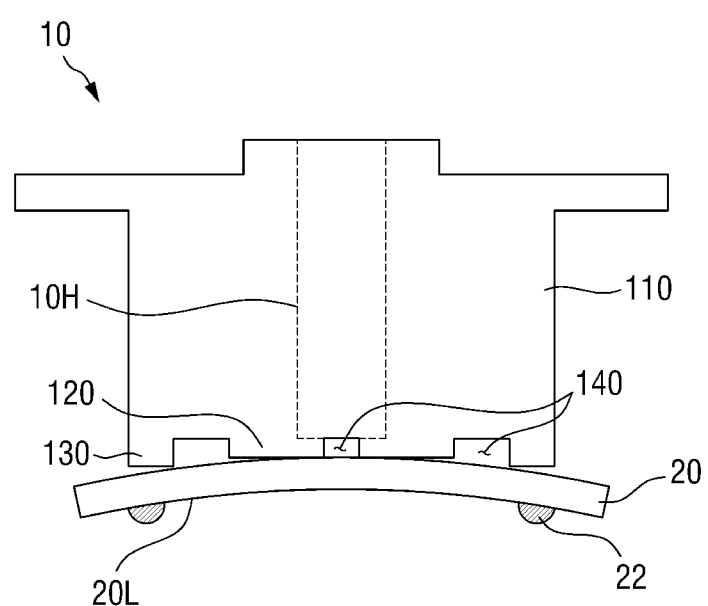

Referring to FIG. 5B, the bonding apparatus 10 may pick up the first semiconductor package substrate 20.

For example, vacuum pressure may be applied to the bottom surface of the bonding apparatus 10 through the vacuum hole 10H. That is, vacuum pressure may be applied to the inside of the first trench 140 through the vacuum hole 10H. Accordingly, the bonding apparatus 10 can pick up the first semiconductor package substrate 20 using the vacuum pressure applied to the bottom surface of the bonding apparatus 10.

The bottom surfaces of the first and second protruding parts 120 and 130 may be in contact with the top surface of the first semiconductor package substrate 20. As already described above with reference to FIGS. 1 through 4, the second protruding part 130 may protrude beyond the first protruding part 120. Accordingly, the first semiconductor package substrate 20 can be a curve that is concave downward. For example, when the first semiconductor package substrate 20 is adhered to the bonding apparatus 10, the bottom surface 20L of the first semiconductor package substrate 20 may be a curve that is concave downward.

Figure 5C:
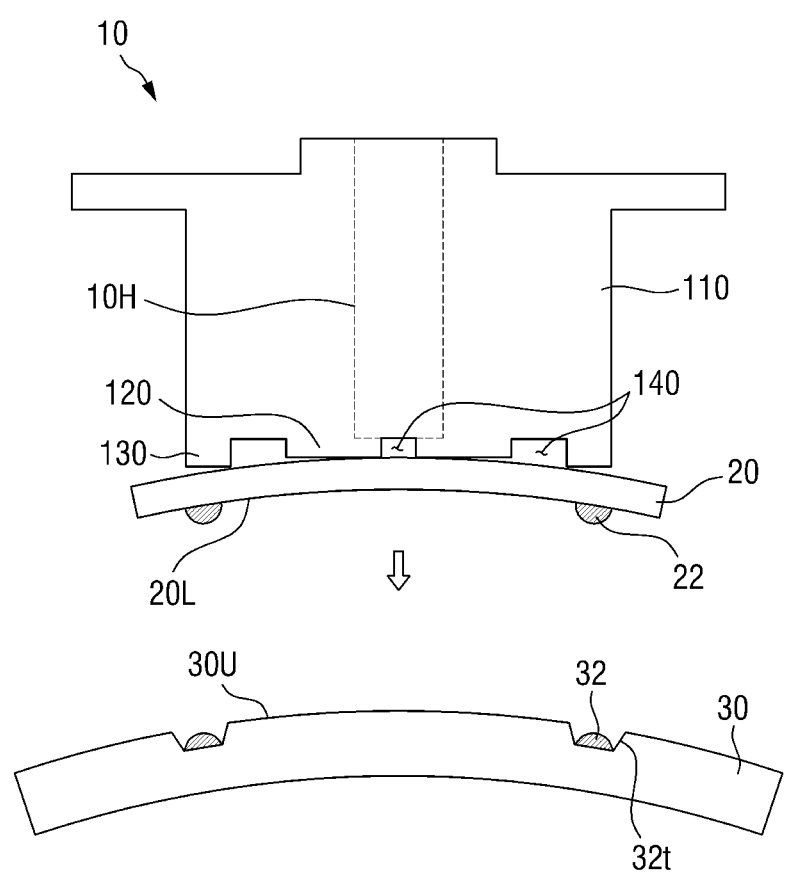

Referring to FIG. 5C, the bonding apparatus 10 may provide the first semiconductor package substrate 20 over the second semiconductor package substrate 30.

In an example embodiment, the bottom surface 20L of the first semiconductor package substrate 20 may be disposed to face a top surface 30U of the second semiconductor package substrate 30.

The bonding apparatus 10 may be driven by, for example, the frame 40 of FIG. 1, and may provide the first semiconductor package substrate 20 over the second semiconductor package substrate 30.

In an example embodiment, second connecting members 32 may be formed on the top surface 30U of the second semiconductor package substrate 30. The second connecting members 32 may be used to electrically connect the second semiconductor package substrate 30 to another semiconductor package substrate (e.g., the first semiconductor package substrate 20). The second connecting members 32 may include, for example, micro-bumps, solder balls, and the like, but embodiments are not limited thereto.

In an example embodiment, the second connecting members 32 may be formed in second trenches 32t of the second semiconductor package substrate 30. For example, the second trenches 32t may be formed at the top of the second semiconductor package substrate 30. The second connecting members 32 may be formed to at least partially fill the second trenches 32t of the second semiconductor package substrate 30.

In an example exemplary embodiment, the second semiconductor package substrate 30 may have warpage. For example, the top surface 30U of the second semiconductor package substrate 30 may be a curve that is concave down Referring to FIG. 5D, the bonding apparatus 10 may mount the first semiconductor package substrate 20 on the second semiconductor package substrate 30.

The bonding apparatus 10 may be driven by, for example, the frame 40 of FIG. 1, to connect the first connecting members 22 and the second connecting members 32.

The warpage of substrates for a semiconductor package may cause connection defects between the substrates. For example, the second semiconductor package substrate 30 may originally be a curve that is concave downward due to its own warpage, but the first semiconductor package substrate 20 may originally be flat. In this example, the distance between the first connecting members 22 and the second connecting members 32 may increase along the edges of the first semiconductor package substrate 20, or the bottom surface 20L of the first semiconductor package substrate 20 and the top surface 30U of the second semiconductor package substrate 30 may be placed in contact with each other so that the first semiconductor package substrate 20 may be tilted with respect to the second semiconductor package substrate 30. These phenomena may cause connection defects between the first connecting members 22 and the second connecting members 32.

However, the bonding apparatus 10 can concavely curve downward the first semiconductor package substrate 20 adhered thereto.

Figure 5D:
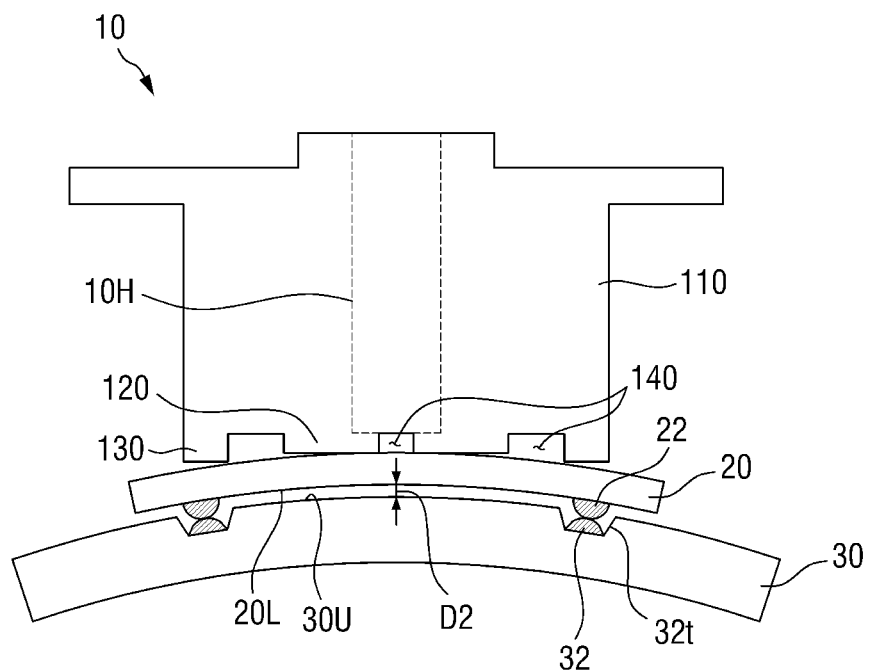

For example, the bottom surface 20L of the first semiconductor package substrate 20 can be concavely curved downward by the first and second protruding parts 120 and 130. Accordingly, the distance between the first connecting members 22 and the second connecting members 32 can be prevented from increasing along the edges of the first semiconductor package substrate 20. Also, the bottom surface 20L of the first semiconductor package substrate 20 and the top surface 30U of the second semiconductor package substrate 30 can be prevented from being placed in contact with each other. For example, as illustrated in FIG. 5D, when the first connecting members 22 and the second connecting members 32 are connected, the center of the bottom surface 20L of the first semiconductor package substrate 20 and the center of the top surface 30U of the second semiconductor package substrate 30 may be a second distance D2 apart from each other. Accordingly, a semiconductor package with an improved connection reliability can be fabricated.

Also, in the bonding apparatus 10, at least part of the first trench 140 may be formed between the first and second protruding parts 120 and 130. The part of the first trench 140 formed between the first and second protruding parts 120 and 130, i.e., the first part 142 of FIG. 4, may provide additional vacuum pressure to the first semiconductor package substrate 20. For example, the vacuum pressure applied by the vacuum pressure 10H may be provided not only to areas (e.g., the third part 146 of FIG. 4) adjacent to the vacuum hole 10H, but also to areas apart from the vacuum hole 10H (e.g., the first and second parts 142 and 144 of FIG. 4). Accordingly, the bonding apparatus 10 can firmly pick up the first semiconductor package substrate 20.

Semiconductor package fabrication equipment according to an example embodiment will hereinafter be described with reference to FIGS. 6 and 7.

Figure 6:
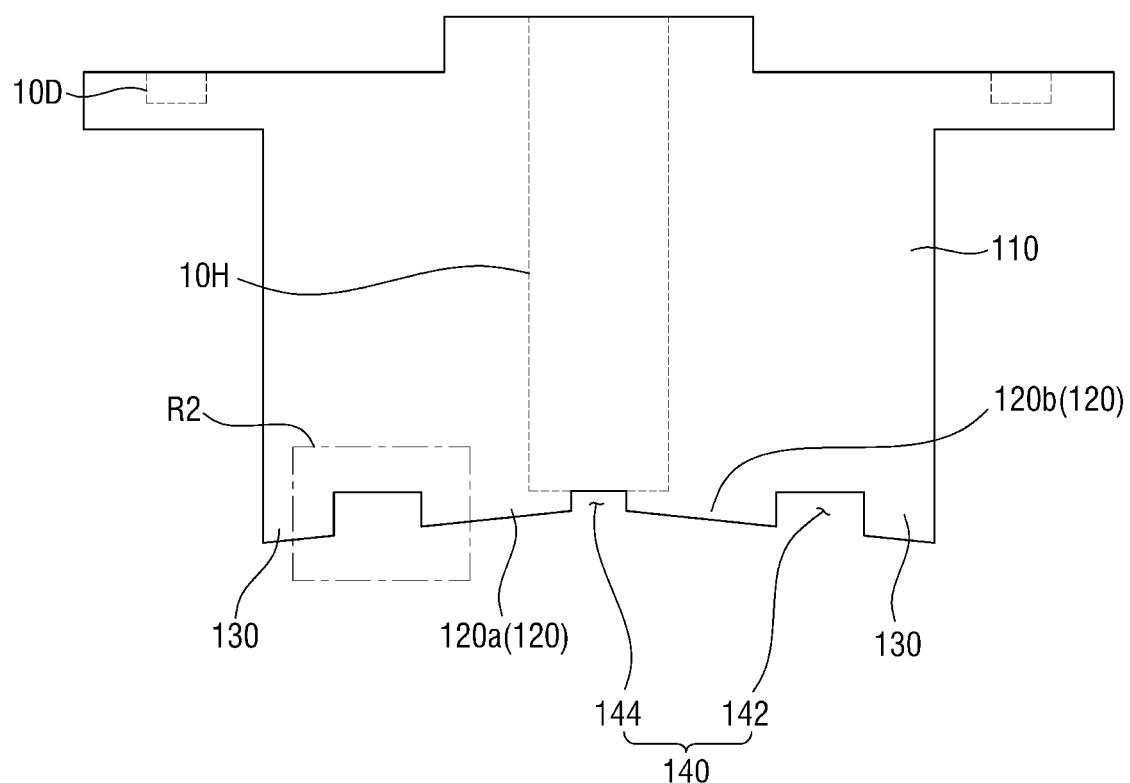
FIG. 6 is a cross-sectional view illustrating a bonding apparatus according to an example embodiment.

FIG. 6 is a cross-sectional view illustrating a bonding apparatus according to an example embodiment. FIG. 7 is an enlarged cross-sectional view illustrating an area R2 of FIG. 6. For convenience, a bonding apparatus 10 of FIG. 6 will hereinafter be described, focusing mainly on the differences with the bonding apparatus 10 described above with reference to FIGS. 1 through 5D.

Figure 7:
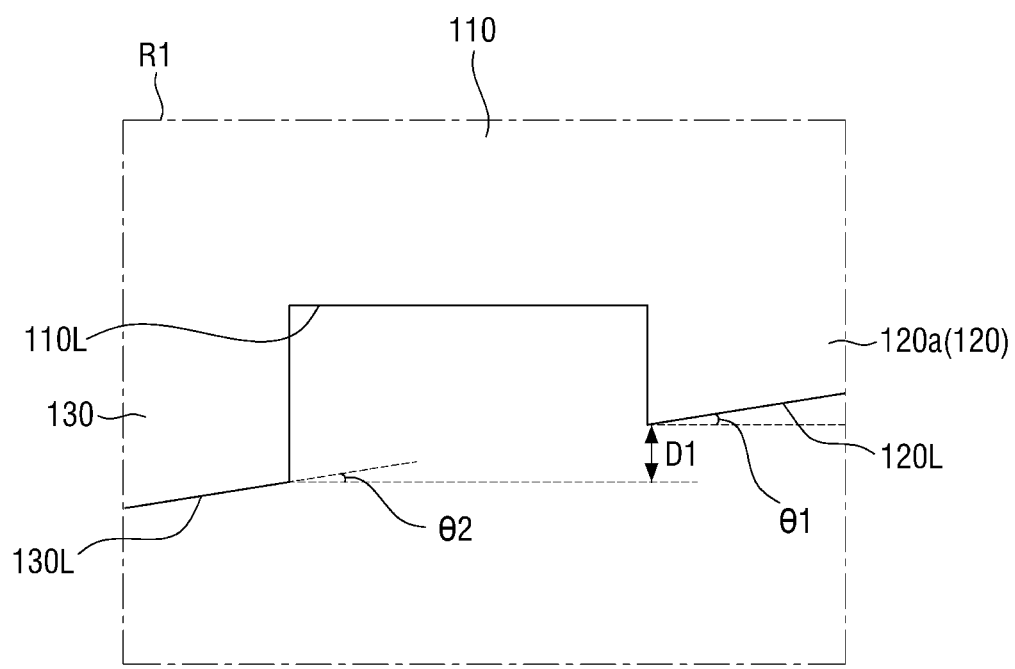
FIG. 7 is an enlarged cross-sectional view illustrating an area R2 of FIG. 6.

Referring to FIGS. 6 and 7, a bottom surface 120L (or first contact surface) of a first protruding part 120 or a bottom surface (or second contact surface) 130L of a second protruding part 130 is inclined.

For example, at least one of the heights of the bottom surfaces (or contact surfaces) 120L and 130L of the first and second protruding parts 120 and 130 may increase closer to the center of a bottom surface 110L of a body part 110.

Both the bottom surfaces (or contact surfaces) 120L and 130L of the first and second protruding parts 120 and 130 are illustrated as being inclined, but the example embodiment is not limited thereto. Alternatively, only one of the bottom surfaces (or contact surfaces) 120L and 130L of the first and second protruding parts 120 and 130 may be inclined.

In an example embodiment, the bottom surface (or first contact surface) 120L of the first protruding part 120 may have a first angle θ1 with respect to the bottom surface 110L of the body part 110. Also, in an example embodiment, the bottom surface (or second contact surface) 130L of the second protruding part 130 may have a second angle θ2 with respect to the bottom surface 110L of the body part 110.

The first and second angles θ1 and θ2 may be the same, but the example embodiment is not limited thereto. Alternatively, the first angle θ1 may be greater than the second angle θ2, or vice versa.

In an example embodiment, an uppermost part of the second protruding part 130 at the bottom surface (or second contact surface) 130L may protrude beyond a lower most part of the first protruding part 120 at the bottom surface (or first contact surface) 120L. For example, the uppermost part of the second protruding part 130 may be lower than the lowermost part of the first protruding part 120 at the bottom surface (or first contact surface) 120L by as much as a first distance D1.

As a result, the height of the bottom surface of the bonding apparatus 10 may increase from the edges to the center of the bottom surface of the bonding apparatus 10. Accordingly, the first semiconductor package substrate 20 adhered to the bonding apparatus 10 can be a curve that is concave downward.

Semiconductor package fabrication equipment according to an example embodiment will hereinafter be described with reference to FIG. 8.

Figure 8:
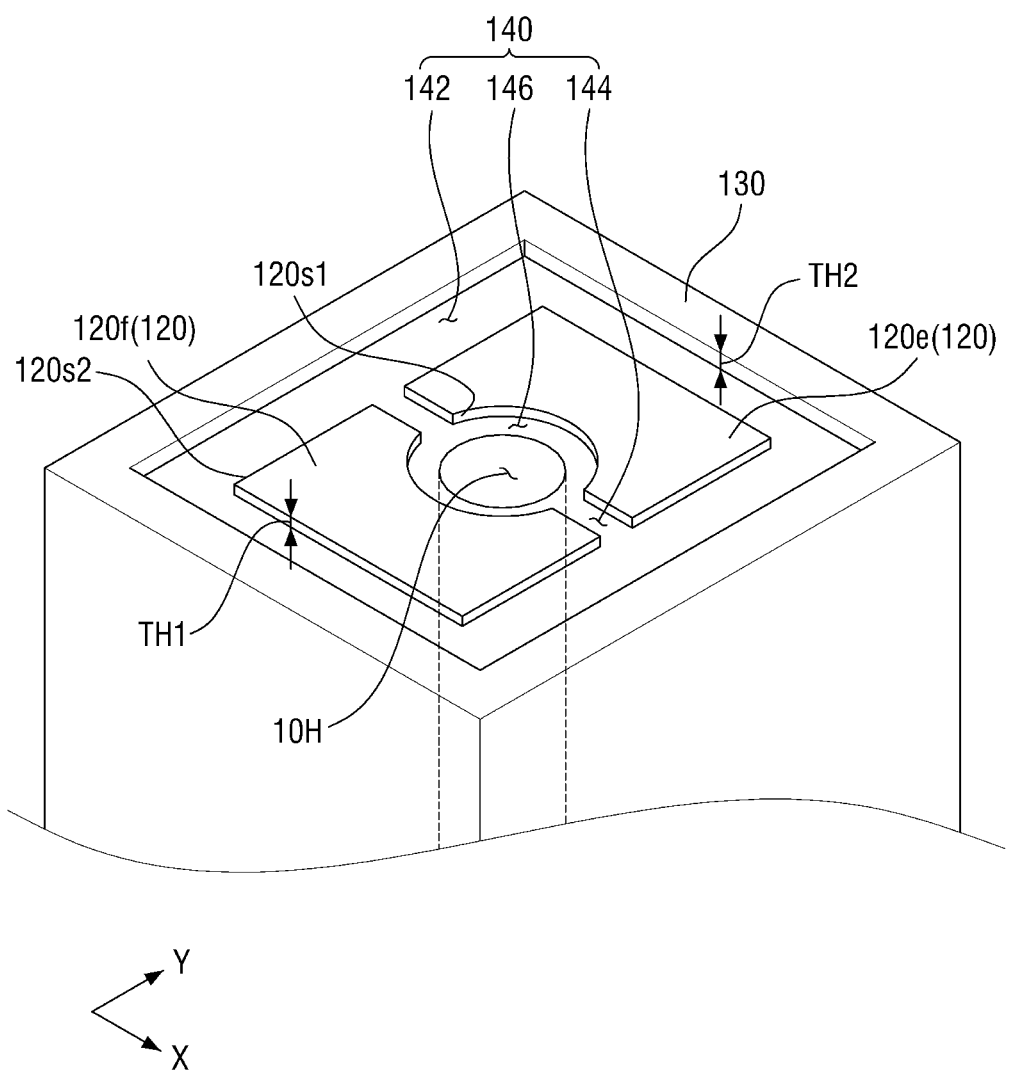
FIG. 8 is a rear perspective view illustrating a bonding apparatus according to an example embodiment.

FIG. 8 is a rear perspective view illustrating a bonding apparatus according to an example embodiment. For convenience, a bonding apparatus 10 of FIG. 8 will hereinafter be described, focusing mainly on the differences with the bonding apparatuses 10 described above with reference to FIGS. 1 through 7.

Referring to FIG. 8, a first protruding part 120 includes fifth and sixth sub-protruding parts 120e and 120f.

The fifth and sixth sub-protruding parts 120e and 120f may be disposed between a vacuum hole 10H and a second protruding part 130. In an example embodiment, the fifth and sixth sub-protruding parts 120e and 120f may be arranged to surround the vacuum hole 10H.

For example, the fifth sub-protruding part 120e may be disposed between the vacuum hole 10H and the second protruding part 130. The sixth sub-protruding part 120f may be, for example, spaced apart from the fifth sub-protruding part 120e with the vacuum hole 10H disposed therebetween. The fifth and sixth sub-protruding parts 120e and 120f may be, for example, spaced apart from each other in a second direction Y.

In an example embodiment, a second part 144 of a first trench 140 may be disposed between the fifth and sixth sub-protruding parts 120e and 120f. The second part 144 of the first trench 140 may be defined by, for example, the bottom surface of the body part 110, the sides of the fifth sub-protruding part 120e, and the sides of the sixth sub-protruding part 120f. In an example embodiment, in a case where the fifth and sixth sub-protruding parts 120e and 120f are spaced apart from each other in the second direction Y, the second part 144 of the first trench 140 may extend in a first direction X. That is, the first trench 140, unlike its counterpart of FIG. 4, may not include a second part 144 extending in the second direction Y.

As already mentioned above, vacuum pressure applied to the first trench 140 can bend the first semiconductor package substrate 20 adhered to the bonding apparatus 10. However, because the first trench 140 does not include a second part 144 extending in the second direction Y, the first semiconductor package substrate 20 adhered to the bonding apparatus 20 can be bent more in the second direction Y than in the first direction X. That is, the shape into which the first semiconductor package substrate 20 adhered to the bonding apparatus 10 is bent can be controlled depending on the shapes of the sub-protruding parts of each of the first and second protruding parts 120 and 130.

In an example embodiment, some of the sides of the first protruding part 120 may extend along the profile of the side of the vacuum hole 10H. For example, the first protruding part 120 (particularly, the fifth sub-protruding part 120e) may include a first side 120s1 that faces the vacuum hole 10H. The first side 120s1 may extend along the profile of the side of the vacuum hole 10H. For example, in a case where the vacuum hole 10H has a cylindrical shape, the first side 120s1 may have a semicircular shape.

In an example embodiment, some of the sides of the first protruding part 120 may extend along the profiles of the sides of the second protruding part 130. For example, the first protruding part 120 (particularly, the sixth sub-protruding part 120O may include a second side 120s2 that faces the second protruding part 130. The second side 120s2 may extend along the profile of a side of the second protruding part 130 that faces the first protruding part 120. For example, in a case where the second protruding part 130 extends in a rectangular shape, the second side 120s2 may have a U shape.

While example embodiments have been shown and described above, it will be apparent to those skilled in the art that modifications and variations could be made without departing from the scope of the present inventive concept as defined by the appended claims.

What is claimed is:

1. A bonding apparatus comprising:
a body part;
a vacuum hole disposed in the body part;
a first protruding part protruding in a first direction from a first surface of the body part;
a second protruding part protruding from the first surface of the body part in the first direction and spaced farther apart from a center of the first surface of the body part than the first protruding part in a second direction intersecting with the first direction; and
a trench defined by the first surface of the body part and second surfaces of the first protruding part, the second surfaces protruding in the first direction from the first surface of the body part, and the trench being connected to the vacuum hole,
wherein the second protruding part protrudes farther from the first surface of the body part in the first direction than the first protruding part.

2. The bonding apparatus of claim 1, wherein the vacuum hole penetrates through the body part to the first surface of the body part from a second surface opposite to the first surface of the body part.

3. The bonding apparatus of claim 1, wherein the vacuum hole is configured to apply vacuum pressure to the trench.

4. The bonding apparatus of claim 1, wherein a first thickness of the first protruding part in the first direction is smaller than a second thickness of the second protruding part in the first direction.

5. The bonding apparatus of claim 4, wherein a difference between the first thickness of the first protruding part and the second thickness of the second protruding part is 500 μm or less.

6. The bonding apparatus of claim 1, wherein the second protruding part is provided along an outer edge of the first surface of the body part.

7. The bonding apparatus of claim 1, wherein the trench further comprises third surfaces of the second protruding part protruding in the first direction from the first surface of the body part.

8. The bonding apparatus of claim 1, wherein the first protruding part comprises a first sub-protruding part and a second sub-protruding part which are spaced apart from each other in the second direction extending parallel to the first surface of the body part.

9. The bonding apparatus of claim 8, wherein the trench comprises:
a first part which is disposed between the first protruding part and the second protruding part;
a second part which is disposed between the first sub-protruding part and the second sub-protruding part, and
a third part which is disposed between the first protruding part and the vacuum hole.

10. The bonding apparatus of claim 9, wherein the second part of the trench connects the first part of the trench and the third part of the trench.

11. The bonding apparatus of claim 1, wherein the first protruding part comprises a first bottom surface,
the second protruding part comprises a second bottom surface, and
at least one of the first bottom surface of the first protruding part and the second bottom surface of the second protruding part is inclined with respect to the first surface of the body part.

12. A bonding apparatus comprising:
a body part;
a vacuum hole disposed in the body part and extending through the body part from a first surface of the body part to a second surface opposite to the first surface of the body part;
a first protruding part protruding from the first surface of the body part in a first direction; and
a second protruding part protruding from the first surface of the body part farther from the first surface of the body part than the first protruding part, the second protruding part being disposed farther from a center of the first surface of the body part than the first protruding part.

13. The bonding apparatus of claim 12, wherein the first protruding part comprises:
   a first sub-protruding part which is disposed between the vacuum hole and the second protruding part;
   a second sub-protruding part which is spaced apart from the first sub-protruding part in a second direction extending parallel to the first surface of the body part;
   a third sub-protruding part which is spaced apart from the first sub-protruding part in a third direction extending parallel to the first surface of the body part and intersecting the first direction and the second direction; and
   a fourth sub-protruding part which is spaced apart from the first sub-protruding part with the vacuum hole disposed between the first sub-protruding part and the fourth sub-protruding part.

14. The bonding apparatus of claim 12, wherein a side surface of the first protruding part protruding in the first direction extends parallel with a side surface of the vacuum hole.

15. The bonding apparatus of claim 12, wherein a first side surface of the first protruding part that faces the second protruding part extends along a second side surface of the second protruding part facing away from the first protruding part.

16. A bonding apparatus to which a substrate for a semiconductor package is adhered, the bonding apparatus comprising:
   a body part having a first surface facing the substrate;
   a first protruding part protruding in a first direction from the first surface of the body part; and
   a second protruding part protruding in the first direction from the first surface of the body part farther from the first surface than the first protruding part, the second protruding part being spaced farther from a center of the first surface of the body part than the first protruding part in a second direction intersecting the first direction,
   wherein when the substrate is adhered to the bonding apparatus, the substrate is in contact with a first contact surface of the first protruding part and a second contact surface of the second protruding part.

17. The bonding apparatus of claim 16, further comprising:
   a vacuum hole extending through the body part from the first surface of the body part,
   wherein the vacuum hole is configured to provide vacuum pressure between the first protruding part and the second protruding part.

18. The bonding apparatus of claim 16, wherein when the substrate is adhered to the bonding apparatus, the substrate is curved.

19. The bonding apparatus of claim 16, wherein the substrate comprises an interposer.

20. The bonding apparatus of claim 16, wherein a difference between the first contact surface and the second contact surface in the first direction is 100 μm to 300 μm.

* * * * *